United States Patent [19]

Stern et al.

[11] Patent Number: 5,648,853
[45] Date of Patent: Jul. 15, 1997

[54] SYSTEM FOR INSPECTING PIN GRID ARRAYS

[75] Inventors: Howard Stern, Greenlawn; William E. Yonescu, Smithtown, both of N.Y.

[73] Assignee: Robotic Vision Systems, Inc., Hauppauge, N.Y.

[21] Appl. No.: 444,258

[22] Filed: May 18, 1995

Related U.S. Application Data

[63] Continuation of Ser. No. 164,417, Dec. 9, 1993, abandoned.
[51] Int. Cl.$^6$ .................................................. G01B 11/00
[52] U.S. Cl. ........................ 356/394; 356/237; 382/146; 348/126
[58] Field of Search ........................ 356/394, 398, 356/372, 375, 376, 380, 386, 387, 237; 250/561, 562, 563, 572; 348/125, 126; 29/720, 721, 759

[56] References Cited

U.S. PATENT DOCUMENTS

| | | | |
|---|---|---|---|
| 4,553,843 | 11/1985 | Langley et al. | 356/375 |
| 4,696,047 | 9/1987 | Christian et al. | 356/394 |
| 4,772,125 | 9/1988 | Yoshimura et al. | 356/237 |
| 4,821,157 | 4/1989 | Birk et al. | 356/237 |
| 4,875,778 | 10/1989 | Luebbe et al. | 356/394 |
| 4,978,224 | 12/1990 | Kishimoto et al. | 356/394 |
| 5,208,463 | 5/1993 | Honma et al. | 356/394 |
| 5,274,434 | 12/1993 | Morioka et al. | 356/237 |
| 5,309,223 | 5/1994 | Konicek et al. | 356/375 |

*Primary Examiner*—Hoa Q. Pham
*Attorney, Agent, or Firm*—Max Fogiel

[57] ABSTRACT

An arrangement for inspecting straightness of an array of pins in which the array is illuminated by a thin beam of light. Images of surfaces of the array of pins that are illuminated are projected on a photo-sensitive device. The array of pins is movable relative to the beam of light and the imaging device. The imaging device and photo-sensitive device are also movable relative to the array of pins.

25 Claims, 12 Drawing Sheets

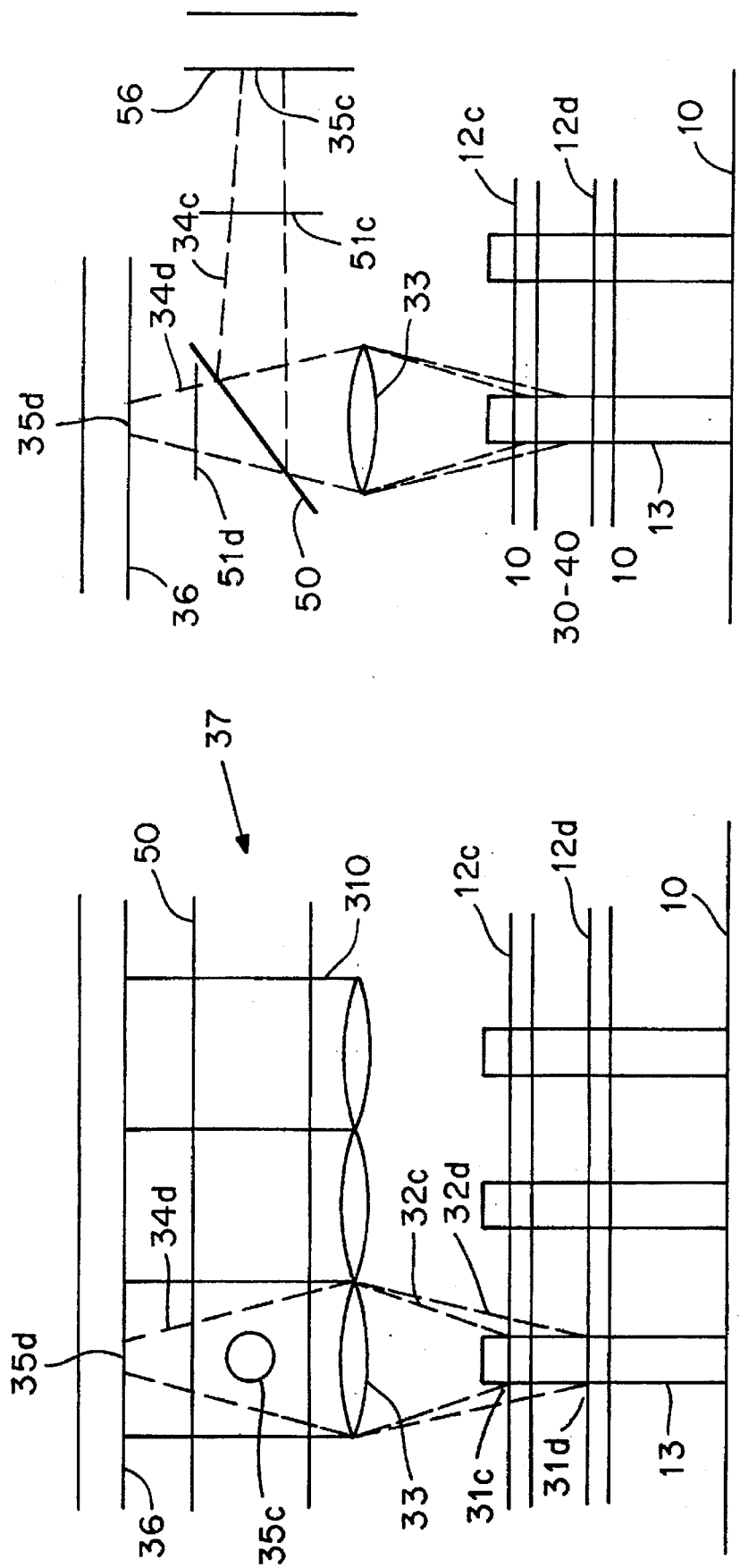

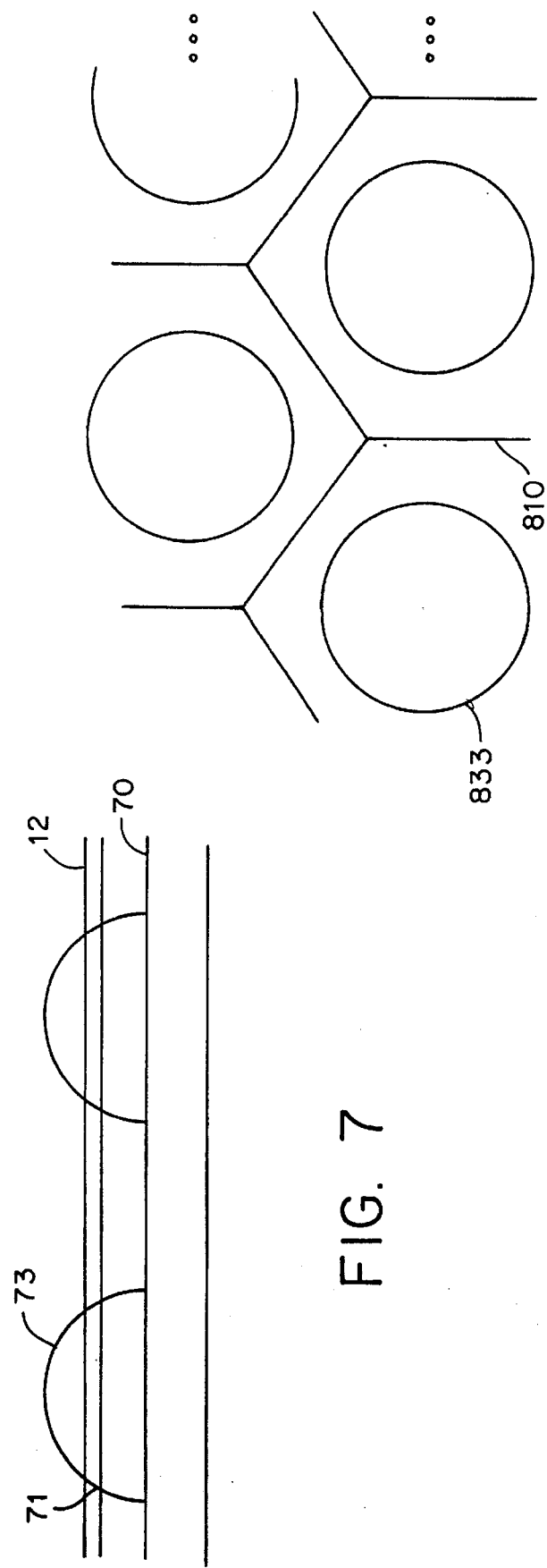

SYSTEM FOR INSPECTING PIN GRID ARRAYS

The present application is a continuation of the parent application Ser. No. 164,417 filed Dec. 9, 1993 now abandoned.

BACKGROUND OF THE INVENTION

Semiconductor chips that carry complex microelectronic circuitry, such as microprocessors that power the latest computers and workstations, interface to other electronic components via a large number of electrically conducting paths in order to accommodate the rapid transfer of instructions and data required for the high performance that they are capable of delivering. Pin Grid Arrays (PGA's) are the means by which these large number of conducting paths can be provided. It is important the PGA's provide pins that are straight, erect, and correctly positioned so they may be inserted into printed circuit boards and sockets, particularly for automated assembly. However, in the manufacture and handling of PGA's, pins become bowed or bent over. Manual inspection would be prohibitively expensive, so a need exists for a system which is capable of accurately determining if all the pins of a PGA meet stringent requirements prior to final packaging for shipment. Such a system can also inspect connectors, ball grid arrays, and similar devices which have fields of regularly spaced elements.

SUMMARY OF THE INVENTION

It is therefore an object of the invention to provide an apparatus for detecting when any pin of a Pin Grid Array is out of tolerance, either completely missing, too short, leaning too much, bowed too much, too long, or not within a specified tolerance of its nominal location.

A further object is to provide a system for measuring the position of cross sections of a long narrow cylinder in a regularly spaced 2-D array of such cylinders or similar array of other shaped items.

An additional object is to provide a system for rapidly and automatically inspecting Pin Grid Arrays for pins not within specification or measuring arrays of items for evaluation of their cross section characteristics.

Other objects and advantages of the present invention will become apparent upon reference to the following specification and annexed drawings in which:

Pins of PGA's are normally positioned in a matrix of rows and columns typically spaced 0.1 inch apart. The pins are approximately 0.018 inches in diameter and 0.180 inches tall, surrounded at the base with similar material 0.070 inches in diameter. Since the material at the base is of similar material, a straight down view of the pin by an imaging system tends to provide an image in which the pin and background merge into one non-separable form. If, however, each pin is illuminated with a thin plane of light orthogonal to the pins and the intersection of the light plane with the pin is viewed, then a contour image of the pin's cross section can be obtained. The pin's location can be related to the position of the image. By moving the light plane along the length of the pin, a measure of the pin's location at various cross sections along the pin's length can be obtained. This provides the needed information to determine if the pin is leaning, bowed, or out of position.

Providing a plane of light orthogonal to a pin is made difficult due to the multiple rows of pins casting shadows on the interior pins. To circumvent this problem, the light plane can be derived from multiple angles, such that light has at least one non-shadowed path to each pin. One means of providing this type of light source is to develop a wide thin light plane source of collimated light and then pass the plane through a multiplicity of cylindrical lenses that disperse the light over a wide range of angles uniformly within the plane.

To handle pins bent in any direction it is best to image the pins from all sides. One means to accomplish this is to view directly down on the pin's nominal location with an aperture significantly larger than the pin. The light thus gathered can produce an image of all sides of the pin simultaneously. The image can be impressed on a CCD array to interface to digital processing equipment for automated analysis and determination of the part's quality. An array of lenses at the same 0.1 inch pitch as the pins can enable the simultaneous measurement of more than one pin at a time.

Numerous variations of the invention are possible. To eliminate the need to move the pins relative to the light plane, two or more light planes at desired positions along the pins may be provided. The planes may be strobed sequentially or the planes may illuminate simultaneously if a means for data separation is provided.

Further, measurement at multiple locations along the pins can provide more data about the pins than just in or out of tolerance for leaning and bowing.

BRIEF DESCRIPTION OF THE DRAWINGS

FIG. 2b is a side view of the light source of FIG. 2a.

FIG. 5a is a side view of an imaging system viewing a PGA illuminated by two thin sheets of light.

FIG. 5b is a side view orthogonal to the view of FIG. 5a.

FIG. 6b is a side view orthogonal to the view of FIG. 6a.

FIG. 7 is a side view of a portion of a ball grid array illuminated by a thin sheet of light.

FIG. 8 is a plan view of a portion of a lens array for imaging closely spaced objects.

FIG. 9b is a side view of the arrangement of FIG. 9a.

DESCRIPTION OF THE PREFERRED EMBODIMENTS

Figure 1:
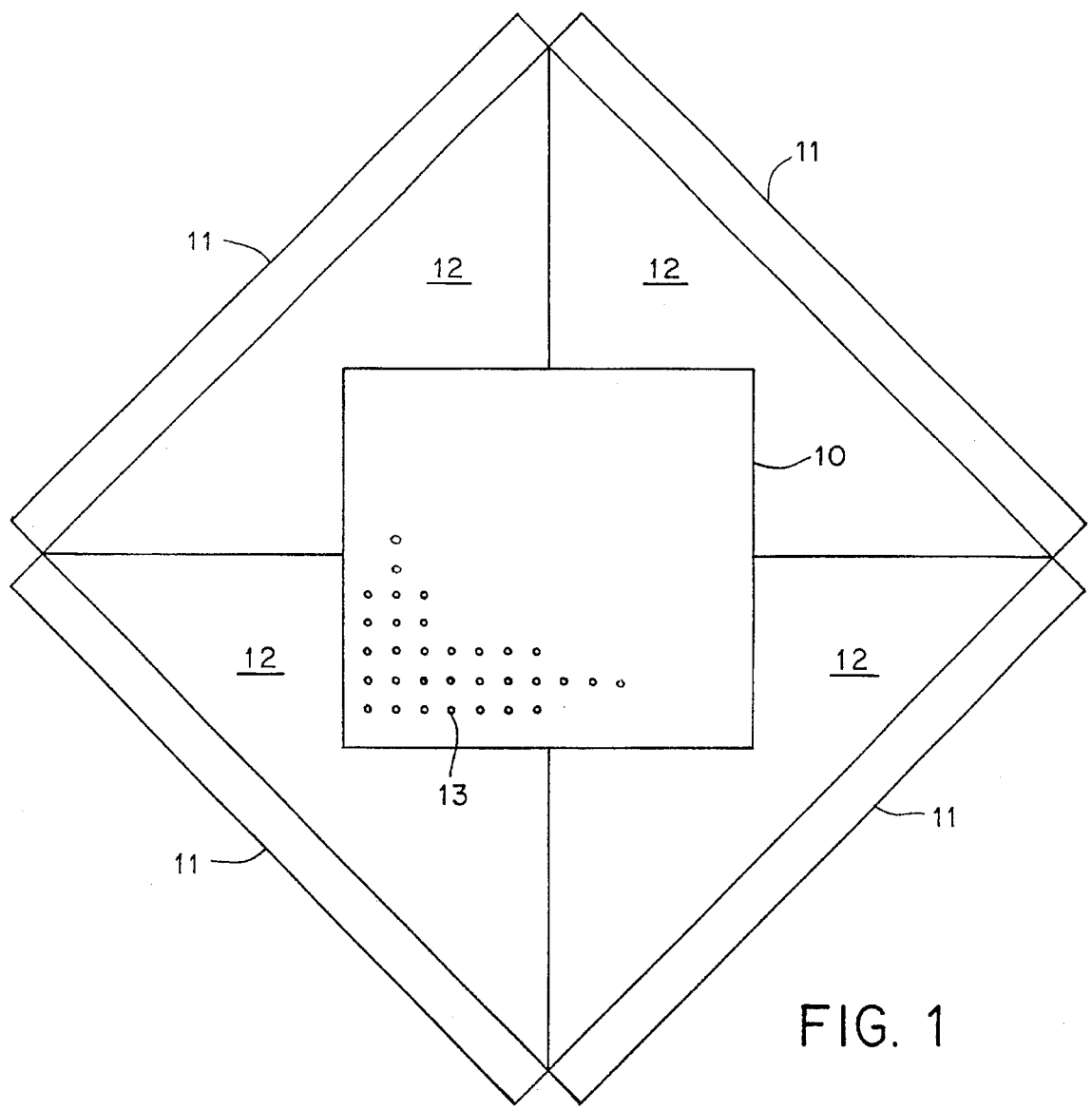
FIG. 1 is a plan view of a PGA illuminated by thin sheets of light from multiple light sources.

FIG. 1 shows a plan view of a Pin Grid Array (PGA) package 10 with the pins 13 facing the viewer. The invention provides preferably three or more light sources 11 that surround PGA 10 and project co-planar thin sheets of light 12 essentially parallel to the surface of PGA 10 and intersecting pins 13 at a specified height above the surface of PGA 10 that can be varied.

Figure 2A:
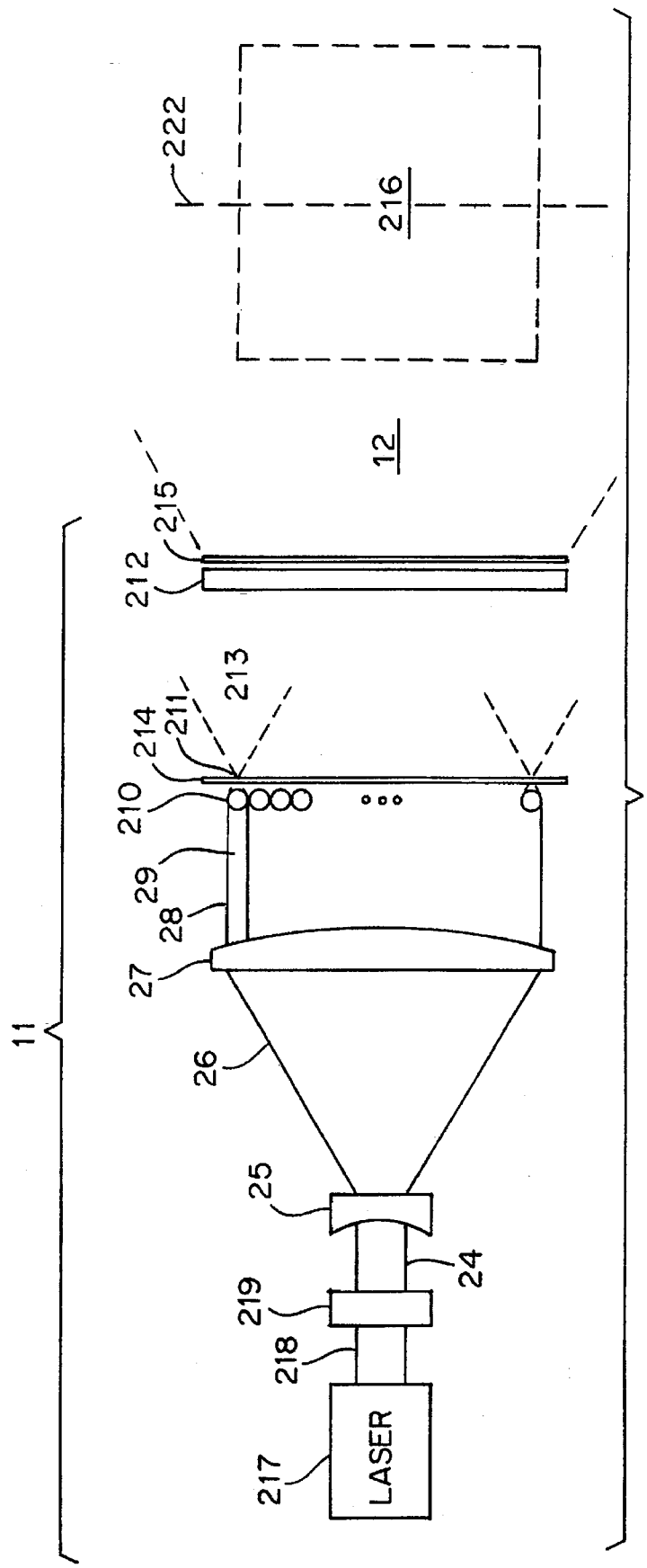
FIG. 2a is a plan view of one light source capable of providing a thin sheet of light.
Figure 2B:
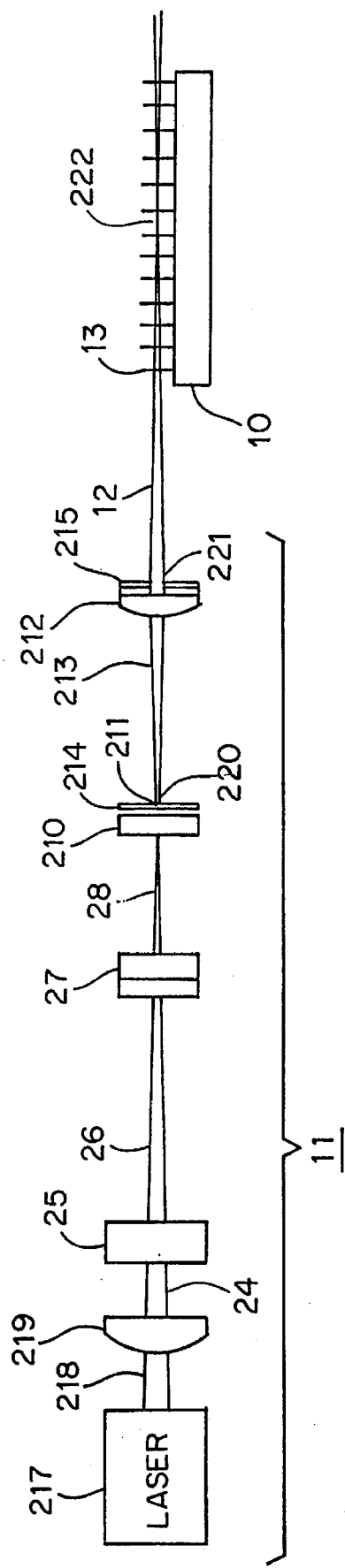

Light from source 11 is projected uniformly in all directions within plane 12 from multiple locations along the length of source 11 so that shadowing of interior pins 13 is essentially eliminated. FIGS. 2a and 2b show in detail how this is accomplished.

Source 11, shown in plan view in FIG. 2a, comprises a light source that may have a flash lamp, incandescent or laser 217 that provides a collimated light beam 218. Positive cylindrical lens 219 focuses beam 218 to a narrow waist at the location of cylindrical rod lenses 210 along path 24, 26, 28. Negative cylindrical lens 25 then spreads beam 24 in one dimension to fan beam 26 which is then collimated at a dimension much wider than beam 28 by positive cylindrical lens 27. If this does not produce a beam 28 sufficiently wide, then a second set of lenses are required to spread beam 54 to a final width beam 28. These lens stages and light beam 218,28 is shown in side view in FIG. 2b.

Light beam 28, if projected on pins 13 of PGA 10 as shown in FIG. 1 would cast shadows on interior pin 13 that do not have an unobstructed path to the light source 11 along the parallel light rays of collimated beam 28. To alleviate this problem cylindrical rod lenses 210 are inserted perpendicular to the plane of the beam 28. The rods 210 are placed contiguously so that each focuses a segment 29 of the collimated light beam 28 through its own focal point 211 and thence spread into a fan beam 213 within projected beam 12.

Lens 219 focuses light beam 218 to a narrow waist at rods 210 which is then imaged by positive cylindrical lens 212 to a narrow waist along line 222 near the center of the inspection area 216. This system of lenses and spacing is selected to provide a thin beam of light 12 no thicker than a prescribed amount over area 216. If the light beam waist at rods 210 isn't sufficiently narrow or clean, field stop 214 with a narrow slit 220 can be employed. An aperture stop 215 with narrow slit 221 can be used in conjunction with the lens 212 choice and position to control the thickness of light beam 12 waist at 222. Slit 221 can also clean up the beam 12 to illuminate pins 13 on PGA 10 only between narrowly specified limits.

Figure 3A:
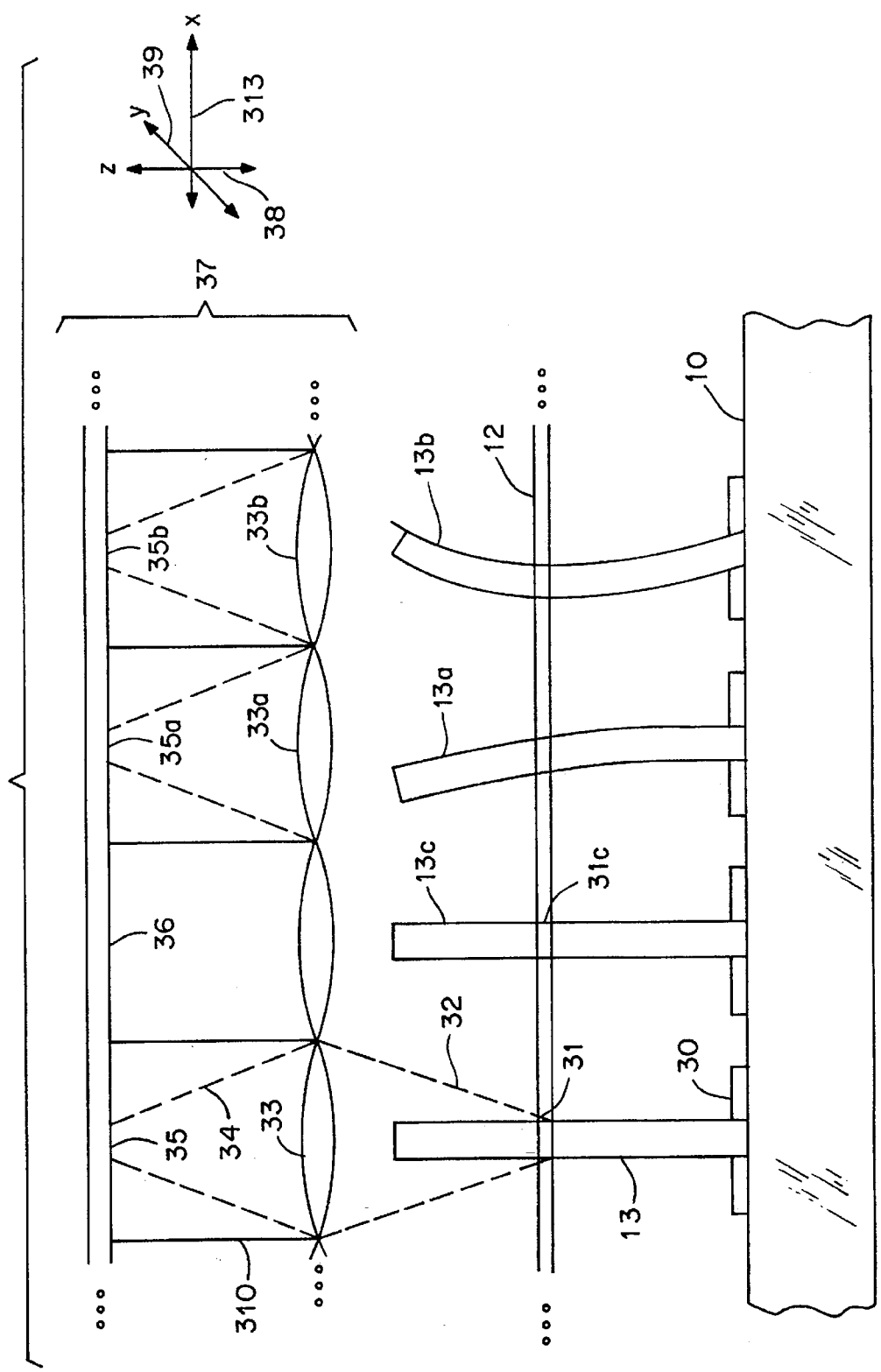
FIG. 3a is a side view of an imaging system viewing a PGA illuminated by a thin sheet of light.

FIG. 3a shows a side view of PGA 10 with pins 13 being illuminate by light beam 12. A camera structure 37 is positioned above the pins 13 to view directly down on the ends of the pins. Within camera 37, a positive spherical lens 33, or equivalent, collects light reflected by pin 13 at 31 along path 32 and images the light along path 34 to location 35 with a magnification of about one on photo sensitive sensor array 36, such as a linear CCD array or video camera with a rectangular array of pixels capable of reporting the position of location 35 along the array length. A lens 33 is provided for each pin 13 in one row on PGA 10 at the nominal 0.1 inch spacing of pins 13, thus allowing simultaneous imaging of all pins 13 in one row at one time to achieve the required inspection throughput rates. The largest lens that is practical is preferred in order to maximize the amount of light collected.

If a pin is leaning more than an allowed amount such as pin 13a, then the image 35a of the cross section of pin 13a, at its intersection with light beam 12, will be displaced on array 36. Camera 37 can then be moved along with beam 12 in the Z direction 38 parallel to pins 13 until beam 12 intersects pins 13 near their free ends. A bent pin 13a will show even greater displacement of image 35a formed by lens 33a in this position. The two measurements by array 36 of the positions of images 35a are sufficient to determine that pin 13a is leaning by more than a specified amount.

If a pin is bowed such as pin 13b, however, its image 35b formed by line 33b might be correctly positioned when viewing a cross section near its free end. However, an out of tolerance bow can be determined from its image location 35b when viewing its cross section nearer the center of pin 13b.

It should be noted that camera 37 and light beam 12 can remain stationary while PGA 10 is moved in direction 38. Likewise, either may be scanned in the Y direction 39, parallel to the surface of PGA 10, to inspect other rows of pins 13 on PGA 10.

Figure 3B:
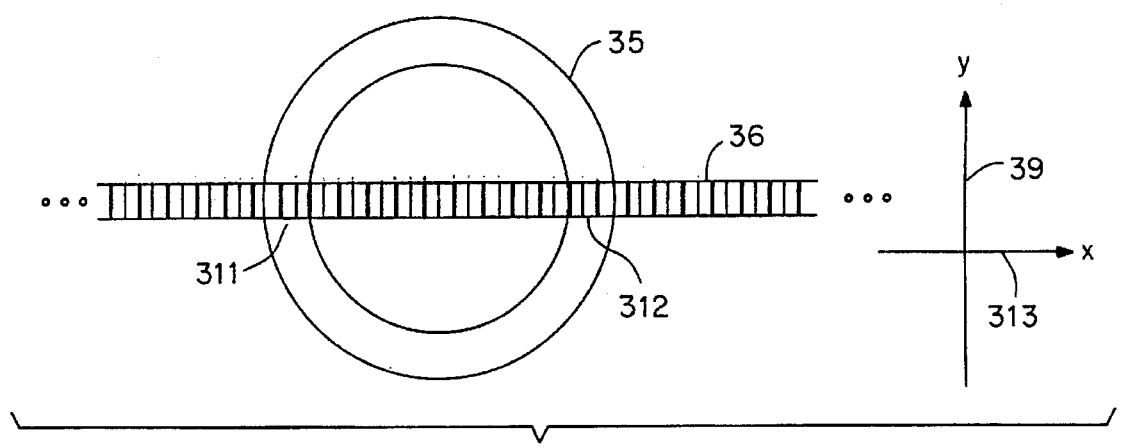
FIG. 3b is a plan view of an image of an illuminated pin.

FIG. 3b provides a plan view of image 35 of the illuminated surface area 31 on pin 13. Photo sensitive sensor array 36 is shown as a linear CCD array intersecting image 35 at areas 311, 312. The location of areas 311, 312 sensed by array 36 along its length in the X direction 313 can be read out from array 36. Camera 37 can then be moved in the Y direction 39 and image 35, though inverted in both X and Y directions by lens 33, will move relative to array 36 in the same Y direction 39 as camera 37. The x locations of areas 311, 312 can be read out for the Y location. This can be repeated for several locations in the Y direction to obtain a set of X, Y values representative of image 35.

Applying well known curve fitting algorithms to the data set can accurately establish the location of the image 35 in X, Y coordinates.

Figure 3C:
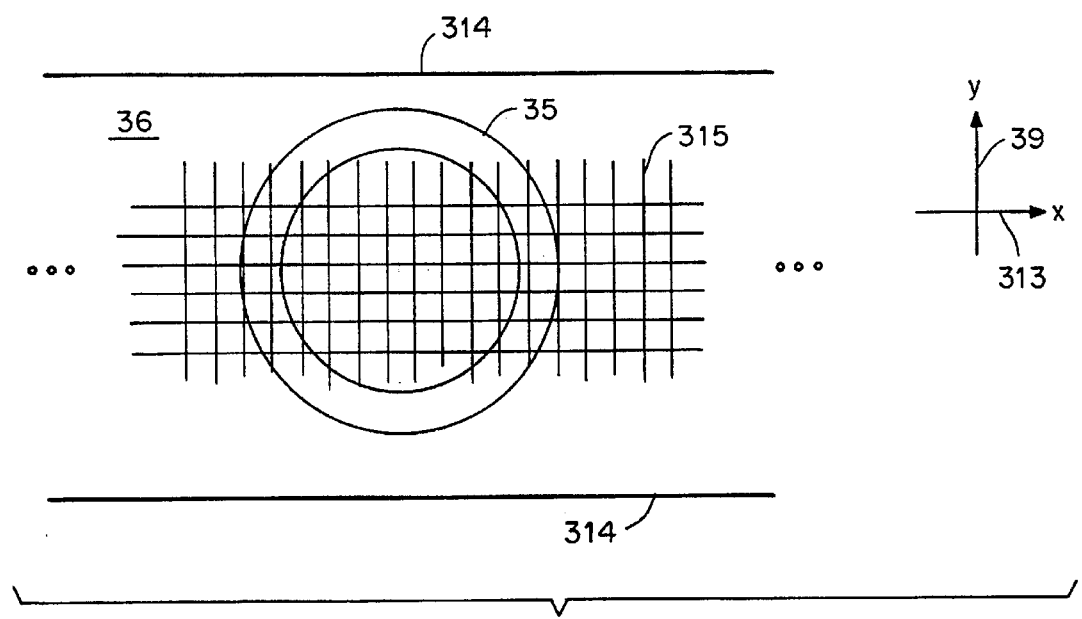
FIG. 3c is a plan view of an image of an illuminated pin on a rectangular imaging array.

A rectangular imaging array, a portion of which is depicted in FIG. 3c, could be used in place of the linear array 36 with similar results. An imaging array 36 may be large enough to obtain the full image data for 1 or more rows of pins 13. If data from more than one row of pins 13 are to be obtained at one time, however, then more than one row of lenses 33 are required. A camera 37 using a rectangular imaging array could also be moved in Y direction 39 to measure additional rows of pins 13.

In a rectangular imaging array, the array of sensing sites 315 extend to the borders 314 of array 36. The physical location of each site 315 is well defined and can individually report a value proportional to the light incident upon it. Again, curve fitting can be used to obtain a precise indication of the location of image 35 in X, Y co-ordinates. Whereas it is practical to continuously scan a linear array and strobe a light source to capture data, it is preferable to step scan a rectangular imaging array to cover larger areas. The rectangular array is brought to one position, allowed to store an image, and then stepped to the next position while the data is read out.

Since lens 33 has a narrow field of view at 31 and light beam 12 illuminates a narrow region, the system is essentially unaffected by objects in the background such as collar 30. However, lens 33a can image the illuminated area 31c on pin 13c at position 35b. To prevent this from occurring, a field stop 310 is placed between each lens 33 between the lens 33 and surface 36, or between lenses 33 on the side facing the pins 13, or both locations.

Figure 4:
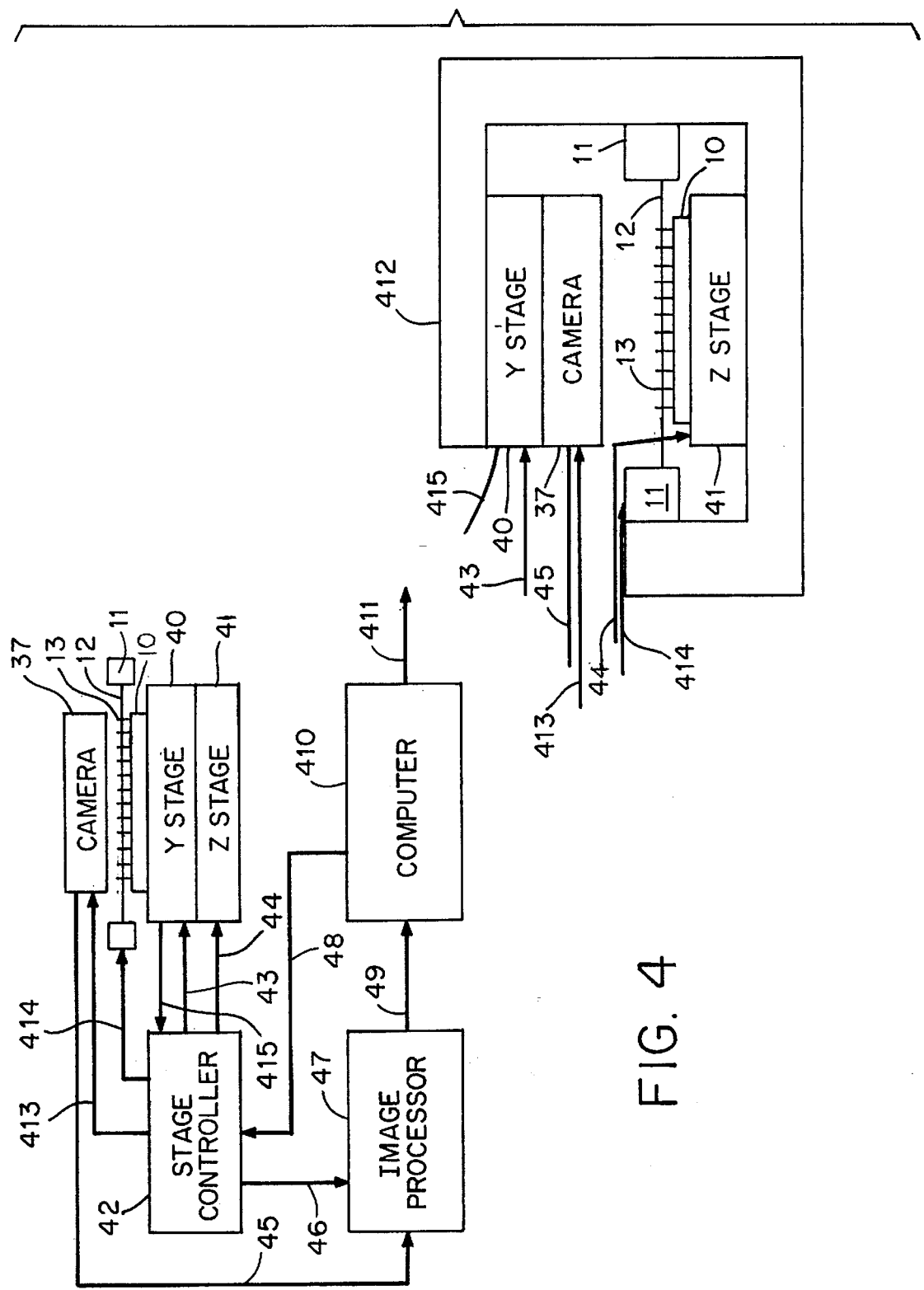
FIG. 4 is a schematic view of a PGA inspection system.

A preferred arrangement forming a PGA inspection system is shown schematically in FIG. 4. Frame 412 provides a fixed mounting position of light sources 11. Since it is difficult to provide the thin beam of light 12 over a large area, it is preferable to have the position of pins 12 stationary within beam 12. Camera 37 scans the rows of pins 13 on PGA 10 via Y stage 40 which transports camera 37 in a direction perpendicular to the plane of the drawing. Stage 40 is supported by frame 412. Z stage 41 transports PGA 10 in a direction parallel to pins 13 to intersect pins 13 with light beam 12 at different positions along pins 13 while fixed focus camera 37 maintains focus in the region of beam 12.

Camera 37 outputs image data signals along signal path 45 to image processor 47. Image processor 47 also receives current position values 46 from stage controller 42 that directs the position of stages 40 and 41 via control signals 43 and 44 respectively in accord with commands from computer 410 along signal path 48. Image processor 47 provides either absolute or relative position data on each pin 13 to computer 410 via signal path 49. Computer 410 determines whether any pin 13 on PGA 10 is out of acceptable tolerance and reports or controls actions, based on the determination, via output signal 411.

To ensure that current position values 46 reflect accurately the location of camera 37 when data are acquired, a preferred arrangement is to use linear encoders on stage 40 that provide a reading and strobe signal along signal path 415 to stage controller 42 that directs the strobe signal to: 1) light source 11 via path 414 causing light source 11 to illuminate pins 13 and 2) camera 37 via path 413 causing camera 37 to record the image and report the image signals along path 45. The delays must be sufficiently short from the time stage 40 reaches the location reported by the encoder via path 415 until light beam 12 illuminates and terminates illumination of pins 13 to introduce no greater position error than can be tolerated in the measurement. At a scan rate of 3 inches per second and a tolerable error of $10^{-4}$ inches, this allows a delay uncertainty of $\frac{1}{3} \times 10^{-4}$ sec or about 33 usec. This is readily achieved within the state of the art.

Since the stage 40 is moving while the light strobe is on, a lag equal to one half of the strobe time will occur. This will have no effect if the scan is taken in just one direction, however if the second scan is in the reverse direction, a correction of twice the lag is required. If the strobe time isn't kept constant within twice the delay uncertainty (67 usec for the values given) then the lag uncertainty will exceed the acceptable tolerance ($10^{-4}$ inches for the values given).

If it is desired to scan the pins in the Z direction, then similar strobe synchronization with the Z encoder for stage 41 is required. For Y scans at fixed Z positions, the Z synchronization isn't required, providing the Z position stabilizes prior to the Y scan.

It may be cost effective to provide two beams of light as shown in FIG. 5a as beams 12c and 12d. The beams illuminate two locations 31c and 31d respectively on pin 13 without the need to provide a Z stage 41 to move PGA 10 in a direction parallel to pin 13. A further benefit is derived by this arrangement since in one scan, rather than two, of camera 37 across the rows of PGA 10 by Y stage 40, all data are obtained. Thus throughput of this system can be greater than that using one light beam 12.

If the depth of field of lens 33 is large enough to encompass both 31c and 31d, then the system operates as follows: Beam 12d is strobed. Light reflected by 31d will image at 35d on photosensitive sensor array 36 via paths 32d and 34d. The data obtained are read out and then beam 12c is strobed. Light reflected by 31c will image at 35d via paths 32c and 34d. The data obtained are read out and the process repeats with beams 12d and 12c alternately strobing as camera 37 is scanned by Y stage 40.

If the large depth of field needed to encompass areas 31c and 31d on pin 13 is not practical or presents other undesired effects, a second sensor array 56 shown in FIG. 5b can be added. FIG. 5b is a side view orthogonal to the view of FIG. 5a. Light reflected from beam 12d by pin 13 on PGA 10 is imaged on surface 36 at 35d by lens 33 along path 34d which passes through beam splitter 50. Beam splitter 50 may be a partially silvered mirror that transmits one-half of the light and reflects the other half towards surface 56. Light reflected from beam 12c by pin 13 is imaged at 35c on surface 56 by lens 33 along path 34c after reflection from beam splitter 50. Surfaces 36 and 56 are placed at appropriate locations to be in focus for their respective images. Again the light planes would be alternately strobed and the images read out. Since both sensors 36, 56 receive light reflected from both light beams 12c and 12d, the sensor must be cleared of any residual charge prior to strobing the light beam to form its image. Field stops 310 can still be placed on the imaging side of lens 33 as shown if desired. An alternate approach would be to use just one sensor array 36 which is moved to the proper distance for each image, thus avoiding the need for beam splitter 50 and second sensor 56.

With two sensors 36, 56 and a beam splitter capable of transmitting light of one wavelength and reflecting light of a second wavelength, both beams of light 12c and 12d can be strobed simultaneously; one beam of one wavelength, the other beam of a second wavelength. This enables a faster rate of data acquisition at the expense of greater complexity. The beam splitter can again be a partially silvered mirror if wavelength filters 51d and 51c pass only the light from beams 12d and 12c respectively. Any other means of providing simultaneous data collection would be equally appropriate.

Figure 6B:
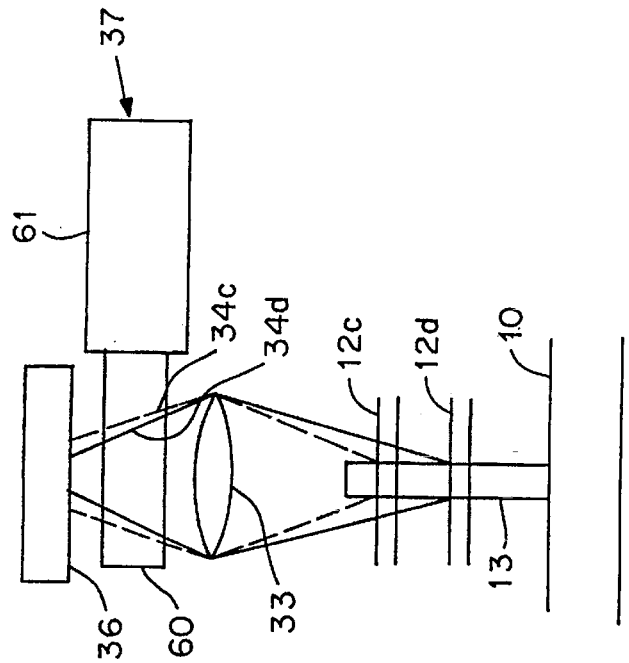
Figure 6A:
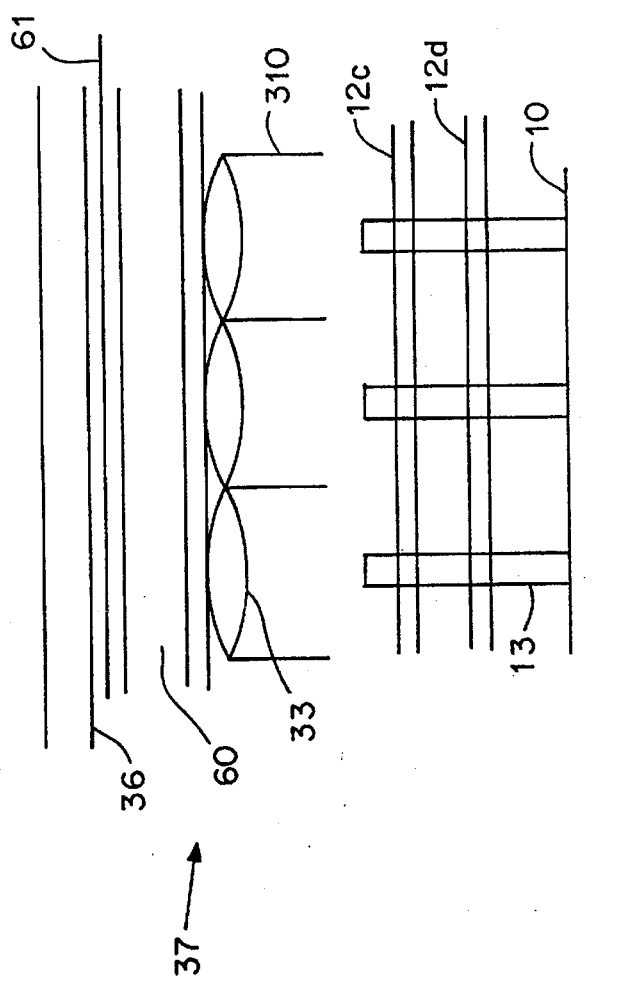
FIG. 6a is a side view of an imaging system viewing a PGA, illuminated by two thin sheets of light, using a variable focal length.

Rather than move surface 36 into two positions when acquiring the images of light reflected by pin 13 on PGA 10 from light beams 12c and 12d, the effective focal length of lens 33 can be changed as shown in FIGS. 6a and 6b. Transport mechanism 61 within camera 37 can move a refracting medium 60, such as glass, into light path 34d from beam 12d causing it to focus at the surface 36 which is placed at a position where light path 34c from beam 12c focuses with medium 60 retracted. Since field stops 310 would obstruct medium 60 from being inserted into light path 34d if the field stops 310 were placed between surface 36 and lens 33 (unless slots in medium 60 are provided), the fields stops would preferably be placed on the opposite side of lens 33. Beams 12c and 12d can be strobed alternately with medium 60 retracted and inserted respectively while camera 37 scans PGA 10, or one scan by camera 37 can be made over all rows of pins 13 on PGA 10 with light beam 12c on and medium 60 retracted, followed by a scan with medium 60 inserted and light beam 12d illuminating pins 13.

The invention thus far described has generally referred to taking data on pin cross section position at two positions along the length of the pin. However, the apparatus described can provide data accurate to better than 0.001 inches over the entire cross section, and can therefore be used for measuring pin contours at many positions and delivering data useful for engineering development, research, and quality control. A measurement above the normal pin height can verify no pins are too long. Other objects such as connectors with exposed pins can similarly be measured. Ball grid arrays (BGA) can also be measured which have arrays of hemispherical solder lumps as shown in side view in FIG. 7. Solder 73 on BGA 70 is illuminated by a thin light beam 12 that completely surrounds the array. The illuminated surface 71 is imaged and its data reported as for PGA 10 of FIG. 4.

Measurement at multiple positions can be obtained with a single light beam 12 and relative motion between the beam 12 and PGA 10, BGA 70, or connector; with multiple light beams; or a combination thereof. Defects in cross section such as nicks and protrusions can be reported as well as location, leaning, bowing, or length. Resolution can be improved by data averaging techniques and thinner light beams.

Since the pitch or distance between pins or solder lumps in an array may be smaller than can be accommodated by a one-for-one linear array of lenses, more than one linear array of lenses, each with its own linear array of photodetectors can be used to image alternate columns of pins or solder lumps. Likewise if the subsequent rows of pins or solder in the array are offset such as to present an apparently closer spacing of objects, offset arrays of lenses can accommodate this effect. FIG. 8 illustrates in plan view a portion of an arrangement of two rows of lenses 833, each on a pitch twice that of the pins/solder. Thus one row of lenses 833 would image the odd numbered pins and the second row of lenses 833, would image the even numbered pins as the array of lenses were scanned across a pin or solder array. Field stop 810 can be readily positioned between lenses 833 as shown.

The concept can be extended as necessary to three or more rows, each row imaging every third or more pin respectively of a pin or solder array.

Figure 9A:
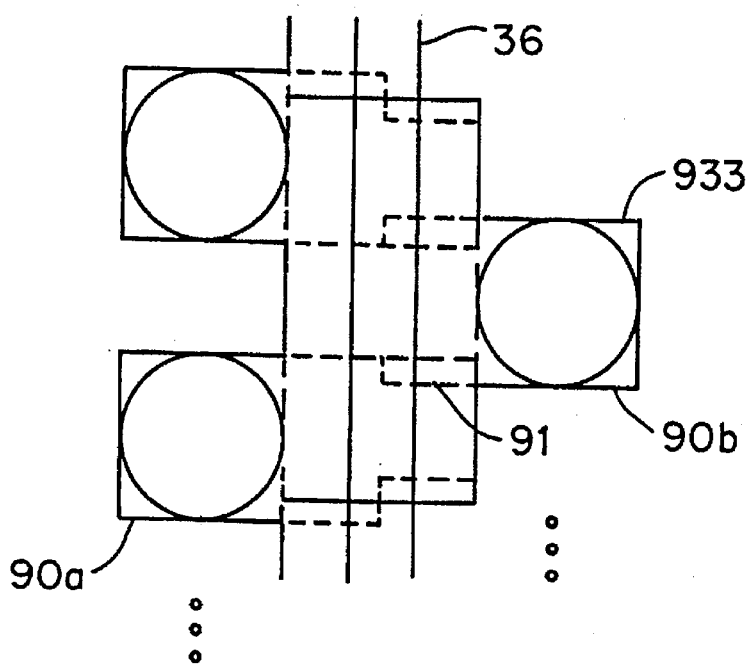
FIG. 9a is a plan view of a portion of a lens array for imaging closely spaced objects with a single photodetector array.
Figure 9B:
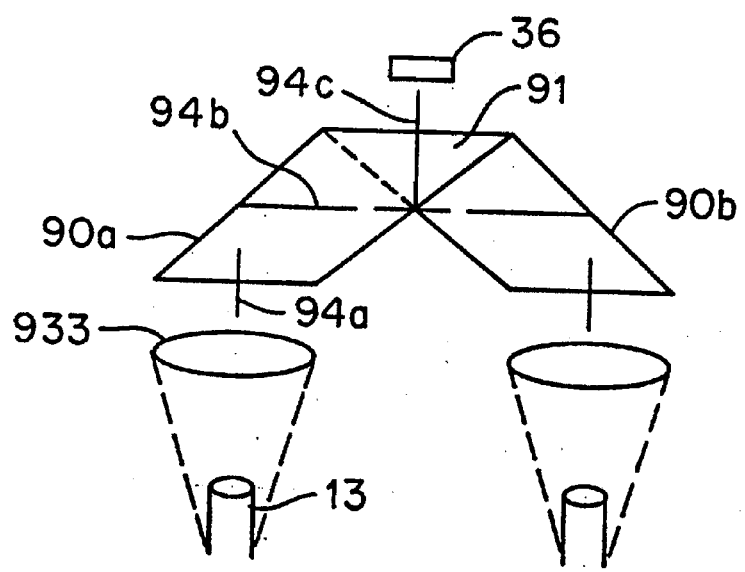

To eliminate the need for using more than one linear array of photodetectors when more than one linear array of lenses is used, as described for FIG. 8, the light paths from the lenses to the photodetectors can be altered. FIG. 9a shows a plan view of a portion of a system employing just one photodetector array 36 and two linear arrays of lenses 933. In order to guide the light collected by lenses 933 to detector 36, each lens has a prism, such as 90a, associated with it. FIG. 9b shows this as a side view.

In FIG. 9b we can see the light gathered by lens 933 from pin 13 travels along path 94a, entering prism 90a via a face perpendicular to path 94a. Light path 94a is reflected along path 94b and then reflected once more along path 94c to detector 36 by the surfaces of prism 90a.

One difficulty arises if it is desired to capture all of the light gathered by lens 933; prisms 90a and 90b have to be as wide as lens 933 if the separation between lens and prism is small. This introduces an interfering region 91 between prisms 90a and 90b since lenses 933 are placed in two rows because they are too large to fit contiguously. One way to accommodate the interference is to remove ½ of the interfering volume from each of prisms 90a and 90b as shown in FIGS. 9a and 9b.

This results in a small light loss if any of the light is blocked. Since the light is converging to a focus on detector 36, only the edges of the imaging region (in the vicinity of interfering region 91) should be significantly affected. However, any image that far from the nominal image location, centralized between interfering regions 91, would signal a product defect and an imperfect image would not be critical. Field stops can be effected by opaquing the sides of prisms, such as 90a, b.

It should be noted that two reflecting surfaces are required for each lens 933 and a prism is just one way of providing this property. Though increasingly difficult, the concept can be extended to more than two rows of lenses.

Figure 9C:
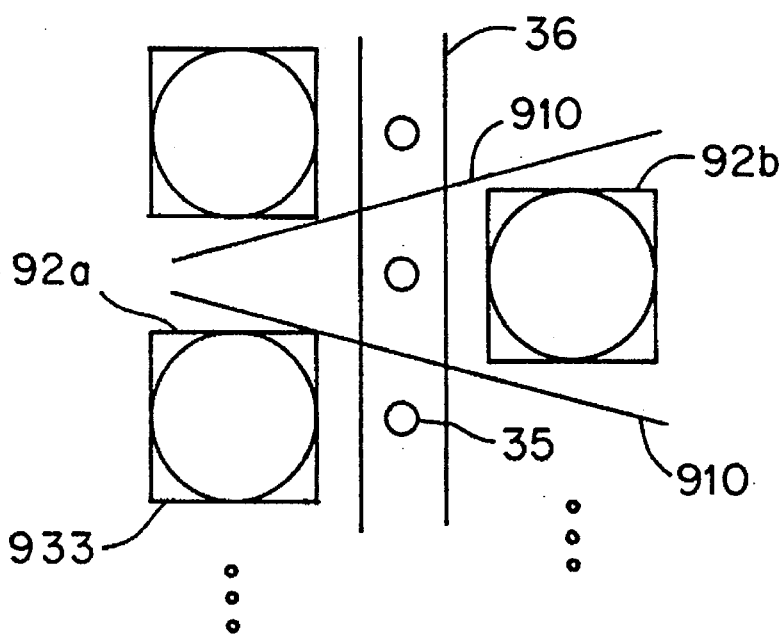
FIG. 9c is a plan view of a portion of a lens array for imaging closely spaced objects with a single photodetector array.
Figure 9D:
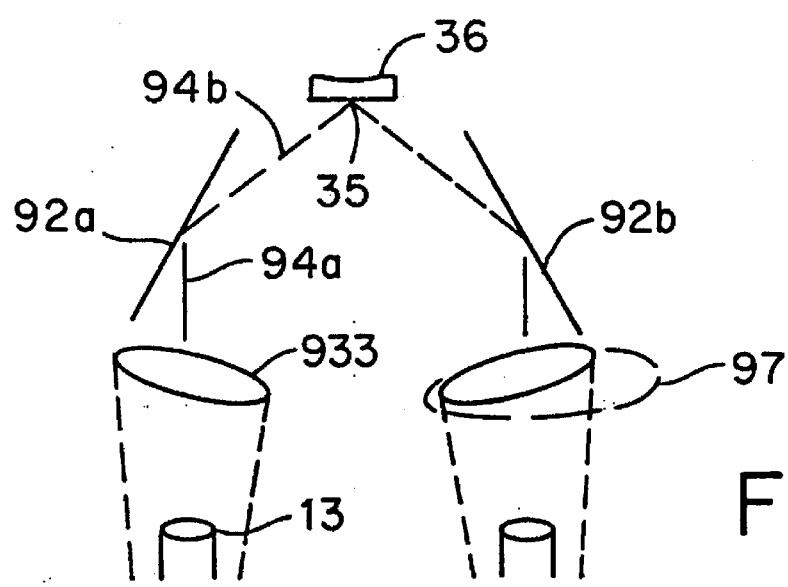
FIG. 9d is a side view of the arrangement of FIG. 9c.

FIG. 9c shows a plan view of a portion of an arrangement of two linear rows of lenses 933, which only requires one reflecting surface, such as 92a, to redirect the light collected by lens 933 to linear photo detector array 36. The light collected by lens 933 from pin 13 follows path 94a, reflects off surface 92a to path 94b to image 35 on the surface of detector 36. Since the path 94b is at an angle to the surface of detector 36, the image plane will be inclined to the detector 36 surface. Thus a good focus on a plane containing detector 36 surface for all pin 13 locations relative to lens 933 will not be possible. This may be acceptable for a linear array since focus is only required along the narrow width of the array (in fact it may be desirable in order to reduce the depth of field to exclude background) However, for a rectangular imaging array, in particular, the image plane inclination can be corrected by tilting lens 933 an amount such as 97 to bring the image plane for the illuminated surface band of pin 13 to coincide with the surface of detector 36. Each, lens 933 will be tilted by the same amount and have an associated reflecting surface, such as 92a and 92b, to form an image 35 on detector 36. The concept 36 can be extended to more than two rows with increasing difficulty. Field stops 910 can be positioned as shown.

Figure 10:
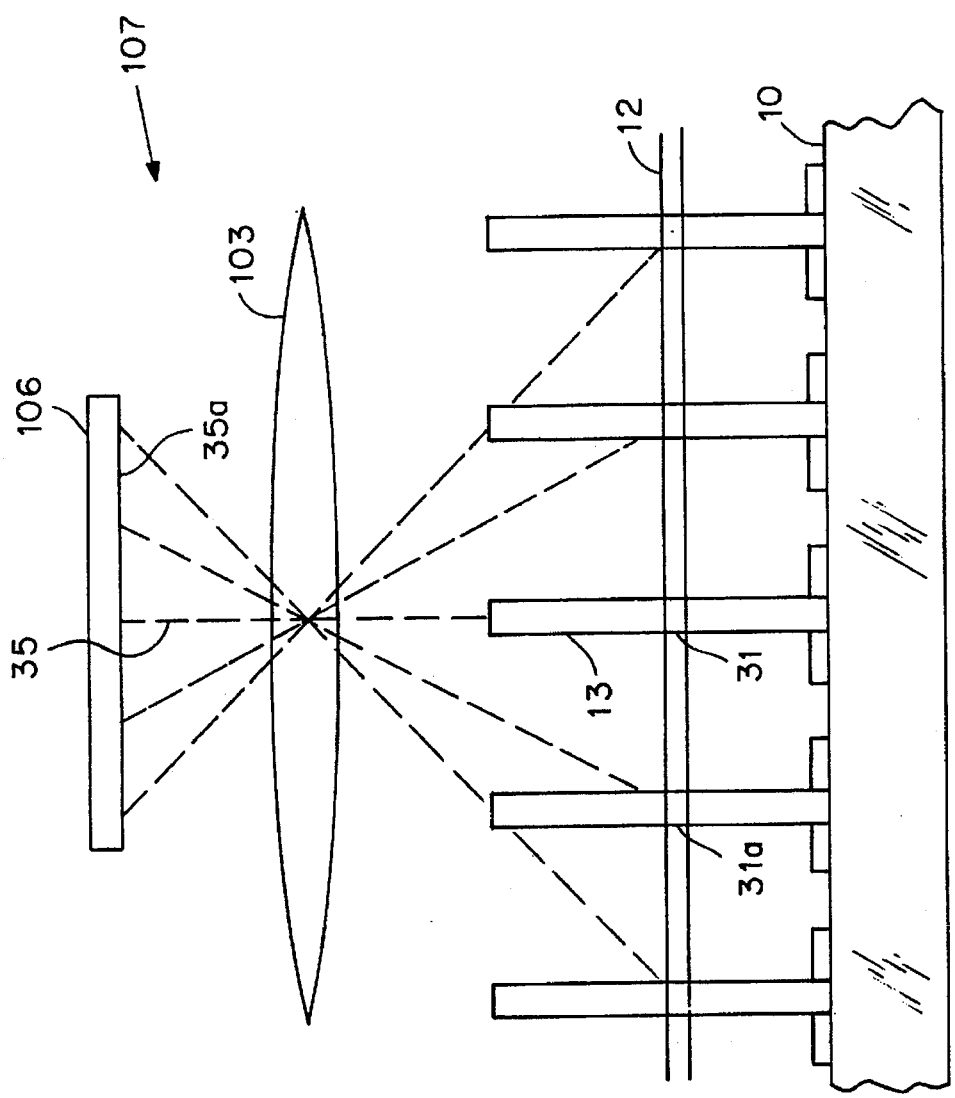
FIG. 10 is a side view of an imaging system viewing a PGA illuminated by a thin sheet of light using a rectangular imaging array.

FIG. 10 illustrates the invention when using a single lens 103 rather than an array of lenses. As before a thin sheet of light 12 surrounds pins 13 on PGA 10. However, a large aperture lens 103 images the illuminated areas 31 of several pins 13 located in an area on PGA 10 to a rectangular imaging array 106. Illuminated area 31 images to location 35, illuminated area 31a images to location 35a, and so on. As long as pins 13 lie within the boundary of lens 103, light can be gathered from all sides of each pin 13 and produce a full circular image 35 for each pin as previously seen in FIG. 3c for a small lens. Lens 103 and array 106 form camera 107 which can be stepped to image other areas of GPA 10, reporting the image data to be processed into location data.

What is claimed:

1. Apparatus for inspecting straightness of an array of pins comprising:
    means for illuminating said array of pins with an encompassing thin beam of light;
    photo sensitive surface means for reporting the locations of images incident thereon; means for collecting diffuse illumination reflected from said pins at a plane of intersection of said thin beam of light with said pins without obscuration of any pin by any of the other pins;
    means for imaging surfaces of said array of pins illuminated by said beam of light onto said photosensitive surface means;
    means for moving said array of pins relative to said beam of light and means for imaging; and
    means for moving said means for imaging and photo sensitive means relative to said array of pins for producing a full contour image of each entire pin; images of said pins being obtained in three dimensions along the entire length of the pin; optical elements for intercepting said thin beam of light and diverging said beam of light to provide an effect that said beam of light emanates from an array of contiguous light sources located adjacent said optical elements for reducing shadowing effects of adjacent pins, each of said pins having a tip, said diffuse illumination only being radiated at substantially 90 degrees to said beam of light and being directed at said photo sensitive means when said plane intersects a pin below the tip of the pin, said diffuse illumination having a substantially lower intensity than the light intensity reflected from the tip; unobscured images of pins in inner rows of pins being obtainable from said diffuse reflected intensity.

2. Apparatus as defined in claim 1 wherein said beam of light is strobed.

3. Apparatus as defined in claim 1 wherein said means for imaging comprises a linear array of lenses spaced at intervals equal to a nominal spacing of one row of said array of pins.

4. Apparatus as defined in claim 3 wherein further field stops are positioned adjacent to each said lens to block light from adjacent pins of said array of pins that could enter the imaging area of each said lens.

5. Apparatus as defined in claim 1 wherein said photo sensitive surface means comprises a linear array of sites at defined linear locations capable of reporting individually in known sequence the amount of light incident upon each said site during a prescribed time period.

6. Apparatus as defined in claim 5 wherein said means for imaging comprises more than one linear array of lenses, with associated reflecting surfaces for imaging upon said linear array of sites, spaced at intervals equal to the nominal spacing of one row of said array of pins multiplied by the number of said arrays of lenses.

7. Apparatus as defined in claim 6 wherein only one of said reflecting surfaces is associated with each said lens and each said lens is oriented to provide an image plane in the plane of said photo-sensitive surface means.

8. Apparatus as defined in claim 1 wherein said means for moving said array of pins provides an accurate readout of position.

9. Apparatus as defined in claim 1 wherein said means for moving said means for imaging provides an accurate readout of position and a trigger signal signifying the time the imaging means reaches said position readout.

10. Apparatus as defined in claim 1 wherein said means for illuminating provides two parallel thin beams of light separated by a given distance and said means for imaging has a depth of field adequate to image both surface areas illuminated by said beams of light onto said photo sensitive means.

11. Apparatus as defined in claim 1 wherein said photo-sensitive surface means comprises a rectangular imaging array at defined locations in an area capable of reporting individually in known sequence the amount of light incident upon each said site during a prescribed time period.

12. Apparatus as defined in claim 11 wherein said means for imaging comprises a single lens capable of imaging the surface of more than one pin of said array of pins at a time onto said photo-sensitive surface.

13. Apparatus as defined in claim 11 wherein said means for moving said array of pins provides an accurate readout of position.

14. Apparatus as defined in claim 11 herein said means for moving said means for imaging provides an accurate readout of position.

15. Apparatus as defined in claim 1 including a plurality of diverging light sources located along a path for generating said beam of light.

16. Apparatus for inspecting straightness of an array of pins comprising:
means for illuminating said array of pins with encompassing two parallel thin beam of light;
photo sensitive surface means for reporting the locations of images incident thereon; means for collecting diffuse illumination reflected from said pins at a plane of intersection of said thin beam of light with said pins without obscuration of any pin by any of the other pins;
means for imaging surfaces of said array of pins illuminated by said beams of light onto said photosensitive surface means;
means for moving said means for imaging and photo sensitive means relative to said array of pins for producing a full contour image of each entire pin; images of said pins being obtained in three dimensions along the length of the pin; optical elements for intercepting said thin beams of light and diverging said beam of light to provide an effect that said beam of light emanates from an array of contiguous light sources located adjacent said optical elements for reducing shadowing effects of adjacent pins, each of said pins having a tip, said diffuse illumination only being radiated at substantially 90 degrees to said beams of light and being directed at said photo sensitive means when said plane intersects a pin below the tip of the pin, said diffuse illumination having a substantially lower intensity than the light intensity reflected from the tip; unobscured images of pins in inner rows of pins being obtainable from said diffuse reflected intensity; said two parallel thin beams of light being separated by a given distance and said means for imaging having a depth of field adequate to image both surface areas illuminated by said beams of light onto said photosensitive means.

17. Apparatus as defined in claim 16 wherein said light beams can be separately strobed.

18. Apparatus as defined in claim 16 wherein said means for illuminating provides two parallel thin beams of light separated by a given distance, said photo sensitive means comprising two photo-sensitive surfaces capable of reporting the locations of images incident thereon, and said imaging means comprising means for imaging the surfaces of said array of pins illuminated by said beams of light and beam splitter means for directing said images to said photosensitive surfaces.

19. Apparatus as defined in claim 18 wherein said light beams can be separately strobed.

20. Apparatus as defined in claim 18 wherein said light beams are of two distinct wavelengths and said imaging means further comprises two filters for blocking light of one said light beam while passing the light of the other said light beam, one said filters being placed to pass the image of one said light beam to one said photo-sensitive surface, the other of said filters passing the image of the other said light beam to the other said photo-sensitive surface.

21. Apparatus as defined in claim 16, wherein said photosensitive surface means comprises at least one line of sites at defined lines of locations capable of reporting individually in known sequence the amount of light incident upon each said site during a prescribed time period, said means for imaging comprising at least one line of lenses spaced at intervals equal to the nominal spacing of one row of said array of pins multiplied by the number of said arrays of lenses.

22. Apparatus as defined in claim 16, wherein said two parallel thin beams of light are two separately strobed parallel thin beams of light.

23. Apparatus as defined in claim 22 including further means for moving said photo-sensitive means, for enabling said means for imaging to image the surfaces of said array of pins illuminated by said beams of light onto said photo-sensitive means.

24. Apparatus as defined in claim 22, including refracting means, said means for imaging having a focal length and comprising further means for inserting and retracting said refracting means for altering said focal length of said imaging means to image the surfaces of said array of pins illuminated by said beams of light onto said photo-sensitive means.

25. A system for measuring an array of regularly spaced articles comprising:
means for illuminating said array of articles with an encompassing thin beam of light; a plurality of diverging light sources located along a path for generating said beam of light and effectively eliminating shadows within said array of articles, said illumination occurring in pulses initiated by a trigger signal; means for collecting diffuse illumination reflected from said articles at a plane of intersection of said thin beam of light with said articles;

means for imaging one row of said array of articles, providing images of the portions of said array of articles illuminated by said means for illuminating;

means for reporting the location and amount of light incident at prescribed locations along a line through said images;

means for moving said means for imaging and means for reporting relative to said array of articles, said means for moving providing an indication of position and a trigger signal at the time said indication of position becomes valid;

means for controlling said means for moving said means for imaging and means for reporting relative to said array of articles;

means for processing said indication of position from said means for moving said means for imaging, said imaging means imaging illuminated surfaces; said indication of position from said means for moving said array of articles and said location and amount of light from said means for reporting into three dimensional co-ordinate values representative of said illuminated surfaces being imaged by said means for imaging for producing a full contour image of each entire article; images of said articles being obtained in three dimensions along the entire length of the article; optical elements for intercepting said thin beam of light and diverging said beam of light to provide an effect that said beam of light emanates from an array of contiguous light sources located adjacent said optical elements for reducing shadowing effects of adjacent articles; and computer means for directing said controlling means and means for processing, and accepting said three dimensional value from said means for processing to produce control signals and reports based on said three dimensional values, said articles being pins, each of said pins having a tip, said diffuse illumination only being radiated at substantially 90 degrees to said beam of light and being directed at said photo sensitive means when said plane intersects a pin below the tip of the pin, said diffuse illumination having a substantially lower intensity than the light intensity reflected from the tip; unobscured images of pins in inner rows of pins being obtainable from said diffuse reflected intensity.

\* \* \* \* \*